(12) United States Patent
Summers et al.

(10) Patent No.: US 10,046,409 B2
(45) Date of Patent: Aug. 14, 2018

(54) METHODS OF MAKING AN ELECTRICAL CONNECTION, AND OF MAKING A RECEPTACLE FOR RECEIVING AN ELECTRICAL DEVICE

(71) Applicant: Raytheon Company, Waltham, MA (US)

(72) Inventors: Matthew H. Summers, Marana, AZ (US); Jeremy C. Danforth, Tucson, AZ (US); David G. Garrett, Tucson, AZ (US); Dmitry V. Knyazev, Tucson, AZ (US); Stephen M. Bagg, Boston, MA (US); Gaines S. Gibson, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 16 days.

(21) Appl. No.: 15/259,921

(22) Filed: Sep. 8, 2016

(65) Prior Publication Data

US 2018/0065202 A1    Mar. 8, 2018

(51) Int. Cl.
*B23K 31/02* (2006.01)
*B23K 1/00* (2006.01)
(Continued)

(52) U.S. Cl.
CPC ........ *B23K 1/0016* (2013.01); *B23K 35/0244* (2013.01); *B33Y 10/00* (2014.12);
(Continued)

(58) Field of Classification Search
CPC .............. B23K 1/0016; B23K 35/0244; B23K 2201/36–2201/42; B23K 1/012–1/015;
(Continued)

(56) References Cited

U.S. PATENT DOCUMENTS 3,182,277 A    5/1965 Ashby
3,665,590 A    5/1972 Percival
(Continued)

FOREIGN PATENT DOCUMENTS

EP    0 632 546 A2    1/1995
WO    2013/087482 A1    6/2013

OTHER PUBLICATIONS

English abstract of CN201112721Y (Sep. 2008).*
(Continued)

*Primary Examiner* — Kiley Stoner
(74) *Attorney, Agent, or Firm* — Renner, Otto, Boisselle & Sklar, LLP

(57) ABSTRACT

A method of making an electrical connection includes soldering using channels in a receptacle to direct hot air (or another hot gas) to effect soldering where the electrical connection is to be made. The connection may be made between device electrical contacts of an electrical device, and other contacts, such as receptacle contacts of the receptacle. The connection may be a blind connection, one in which the connected ends of the contacts are hidden or unable to be directly physically accessed, when the connection is made. The electrical connection may be made between device contacts of an electrical device that is inserted into the receptacle, and receptacle electrical contacts that are part of the receptacle. The channels for directing the hot gas to where the soldering occurs may be parts of the receptacle, for example being produced during additive manufacture of the receptacle.

20 Claims, 3 Drawing Sheets

(51) Int. Cl.
*B33Y 10/00* (2015.01)
*B33Y 80/00* (2015.01)
*B23K 35/02* (2006.01)
*F42B 10/66* (2006.01)
*H01R 4/02* (2006.01)
*H01R 12/51* (2011.01)
*H01R 12/57* (2011.01)
*H01R 43/02* (2006.01)
*B23K 101/36* (2006.01)
*H01R 13/66* (2006.01)
*H05K 1/02* (2006.01)
*H05K 3/34* (2006.01)

(52) U.S. Cl.
CPC ............ B33Y 80/00 (2014.12); F42B 10/661 (2013.01); H01R 4/027 (2013.01); H01R 12/51 (2013.01); H01R 12/57 (2013.01); H01R 43/02 (2013.01); *B23K 2201/36* (2013.01); *H01R 4/02* (2013.01); *H01R 13/6658* (2013.01); *H05K 1/0272* (2013.01); *H05K 3/3494* (2013.01); *H05K 2201/09036* (2013.01); *H05K 2203/081* (2013.01)

(58) Field of Classification Search
CPC ........ B33Y 80/00; B33Y 10/00; H01R 12/51; H01R 4/027
USPC .......... 228/218–220, 179.1–180.22, 245–255
See application file for complete search history.

(56) References Cited

U.S. PATENT DOCUMENTS

| | | | | |
|---|---|---|---|---|
| 4,090,656 A * | 5/1978 | Sato | ................ | B23K 3/02 228/180.1 |
| 4,295,596 A * | 10/1981 | Doten | ................ | B23K 1/012 228/180.21 |
| 4,610,388 A * | 9/1986 | Koltuniak | ................ | B23K 1/012 228/20.1 |
| 4,626,205 A * | 12/1986 | Barkley | ................ | H05K 13/0486 219/230 |
| 4,783,903 A * | 11/1988 | Fernquist | ................ | B23K 1/0008 219/85.13 |
| 4,787,548 A * | 11/1988 | Abbagnaro | ................ | B23K 1/012 222/566 |
| 4,799,617 A * | 1/1989 | Friedman | ................ | H05K 13/0486 228/180.21 |
| 4,805,827 A * | 2/1989 | Coffman | ................ | B23K 1/012 228/20.1 |
| 4,972,990 A * | 11/1990 | Abbagnaro | ................ | H05K 13/0408 228/20.1 |
| 4,995,838 A * | 2/1991 | Ayer | ................ | H01R 4/723 174/84 R |
| 5,027,596 A | 7/1991 | Steenborg | | |
| 5,139,193 A * | 8/1992 | Todd | ................ | B23K 1/012 228/180.21 |
| 5,222,655 A * | 6/1993 | Moretti | ................ | B23K 1/0016 228/230 |
| 5,234,157 A * | 8/1993 | Fletcher | ................ | B23K 3/085 219/227 |
| 5,275,575 A | 1/1994 | Cahaly et al. | | |
| 5,516,030 A | 5/1996 | Denton | | |
| 5,553,768 A * | 9/1996 | Lasto | ................ | B23K 1/012 228/102 |
| 5,579,979 A * | 12/1996 | Kurpiela | ................ | B23K 1/012 228/264 |
| 5,785,237 A * | 7/1998 | Lasto | ................ | B23K 1/012 228/180.22 |
| 5,862,588 A * | 1/1999 | Heim | ................ | B23K 1/012 228/180.21 |
| 6,029,883 A | 2/2000 | Bolde et al. | | |
| 6,059,176 A * | 5/2000 | Azdasht | ................ | B23K 3/0623 219/121.63 |
| 6,153,505 A | 11/2000 | Bolde et al. | | |
| 6,182,884 B1 * | 2/2001 | Ma | ................ | B23K 1/012 228/119 |
| 6,247,630 B1 * | 6/2001 | Terry | ................ | B23K 1/018 228/119 |
| 6,272,742 B1 | 8/2001 | Armezzani et al. | | |
| 6,503,336 B1 * | 1/2003 | Barr | ................ | B23K 1/012 134/199 |
| 6,787,443 B1 | 9/2004 | Boggs et al. | | |
| 7,112,888 B2 | 9/2006 | Kuramoto et al. | | |
| 7,238,881 B1 * | 7/2007 | Barr | ................ | H01L 24/98 174/17 VA |
| 7,989,345 B2 | 8/2011 | Akram et al. | | |
| 8,757,065 B2 | 6/2014 | Fjerstad et al. | | |
| 2005/0098610 A1 * | 5/2005 | Onobori | ................ | B23K 1/0016 228/180.21 |
| 2011/0009206 A1 | 1/2011 | Soracco | | |
| 2011/0275245 A1 | 11/2011 | Annecke | | |
| 2012/0117941 A1 | 5/2012 | Olden et al. | | |
| 2012/0135620 A1 | 5/2012 | Park | | |
| 2012/0135641 A1 * | 5/2012 | Okuyama | ................ | H01R 4/027 439/626 |
| 2013/0292455 A1 * | 11/2013 | Brofman | ................ | B23K 31/02 228/219 |
| 2014/0138732 A1 * | 5/2014 | Sasaki | ................ | H01L 33/62 257/99 |
| 2014/0197153 A1 | 7/2014 | Aguilar et al. | | |
| 2016/0057882 A1 | 2/2016 | Wuerstlein et al. | | |
| 2016/0209128 A1 * | 7/2016 | Stieber | ................ | F28F 3/00 |

OTHER PUBLICATIONS

International Search Report and Written Opinion of the International Searching Authority for corresponding International Application No. PCT/US2017/022857 dated Jun. 22, 2017.

\* cited by examiner

METHODS OF MAKING AN ELECTRICAL CONNECTION, AND OF MAKING A RECEPTACLE FOR RECEIVING AN ELECTRICAL DEVICE

FIELD OF THE INVENTION

The invention is in the field of electrical devices, in particular to making electrical connections, and for receptacles for receiving such electrical devices, in which such electrical connections are made.

DESCRIPTION OF THE RELATED ART

Some electrical devices, such as thrusters for a divert attitude control systems, are installed with blind connections. Such devices are generally installed with the electrical connections being hand wired as part of the installation process.

SUMMARY OF THE INVENTION

A receptacle for receiving an electrical device has one or channels used in a soldering process to make electrical connections, after the electrical device is inserted into the receptacle.

A method of making a receptacle for receiving an electrical device includes additively manufacturing the receptacle such that the receptacle includes one or more channels used for soldering, to make an electrical connection with the electrical device.

A method of making an electrical connection includes directing heated gas through one or more channels of a receptacle, to make a soldered electrical connection after the electrical device is inserted into the receptacle.

Methods and devices described herein solve one or more problems with prior approaches to installing electrical devices, such as avoiding the time-consuming process of making hand-wired electrical connections with the individual devices as part of the installation process, and/or focusing heat applied in soldering to a particular area or areas, thereby avoiding unwanted heating (and possible damage) to other areas.

According to an aspect of the invention, a method of making an electrical connection includes the steps of: inserting an electrical device into a receptacle; melting solder where one or more device electrical contacts of the device and one or more receptacle electrical contacts of the receptacle meet, wherein the melting includes directing heated gas through one or more channels in the receptacle to melt the solder; and making a solid electrical connection between the one or more device electrical contacts and the one or more receptacle electrical contacts by allowing the solder to cool.

According to an embodiment of any paragraph(s) of this summary, the making the solid electrical connection includes making a blind electrical connection that is not externally accessible for manually access to the electrical connection.

According to an embodiment of any paragraph(s) of this summary, the making the solid electrical connection includes making the electrical connection along a bottom of the receptacle, opposite from where the device is inserted into the receptacle.

According to an embodiment of any paragraph(s) of this summary, the receptacle is additively manufactured, with the one or more channels formed in the receptacle as part of the manufacturing process.

According to an embodiment of any paragraph(s) of this summary, the directing the heated gas includes directing heated air.

According to an embodiment of any paragraph(s) of this summary, the directing the heated air includes directing the heated air using a hot air gun.

According to an embodiment of any paragraph(s) of this summary, the directing includes directing heated gas having a minimum temperature of 360° F.

According to an embodiment of any paragraph(s) of this summary, the directing includes directing the heated gas for a time from 1 second to full solder melt.

According to an embodiment of any paragraph(s) of this summary, the directing includes directing the heated gas through the one or more channels over a length of 0.635 cm to 2.54 cm (0.25 inches to 1.00 inch) for each channel of the one or more channels.

According to an embodiment of any paragraph(s) of this summary, further including blocking the one or more channels after the directing the heated gas through the one or more channels.

According to an embodiment of any paragraph(s) of this summary, the melting solder includes melting solder balls initially on one or both of the one or more device electrical contacts and/or the one or more receptacle electrical contacts.

According to an embodiment of any paragraph(s) of this summary, the one or more device electrical contacts are on a protrusion of the device; and the inserting includes inserting the protrusion into a corresponding recess of the receptacle.

According to an embodiment of any paragraph(s) of this summary, the inserting includes, within the recess, engaging the one or more device electrical contacts with the one or more receptacle contacts, which are parts of a circuit card assembly (CCA).

According to an embodiment of any paragraph(s) of this summary, the electrical device is a thruster; the receptacle is part of a fuselage of a projectile; and the making the connection includes connecting the thruster to a control system of the projectile.

According to another aspect of the invention, a method of making a receptacle for receiving a device includes: additively manufacturing the receptacle; wherein the additively manufacturing includes producing channels for allowing flow to a location where one or more receptacle electrical contacts of the receptacle, to enable soldering of the one or more receptacle electrical contacts of the receptacle.

According to an embodiment of any paragraph(s) of this summary, the receptacle defines a space for receiving an electrical device to be electrically coupled to the one or more receptacle electrical contacts; and the one or more receptacle electrical contacts are at a bottom of the receptacle, opposite an opening for receiving the electrical device.

According to an embodiment of any paragraph(s) of this summary, the additively manufacturing includes additively manufacturing the channels with a length of 0.635 to 2.54 cm (0.25 to 1.00 inches).

According to an embodiment of any paragraph(s) of this summary, the receptacle is part of a fuselage of a projectile.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

A method of making an electrical connection includes soldering using channels in a receptacle to direct hot air (or another hot gas) to effect soldering where the electrical connection is to be made. The connection may be made between device electrical contacts of an electrical device, and other contacts, such as receptacle contacts of the receptacle. The connection may be a blind connection, one in which the connected ends of the contacts are hidden or unable to be directly physically accessed, when the connection is made. The electrical connection may be made between device contacts of an electrical device that is inserted into the receptacle, and receptacle electrical contacts that are part of the receptacle. The channels for directing the hot gas to where the soldering occurs may be parts of the receptacle, for example being produced during additive manufacture of the receptacle.

Figure 1:
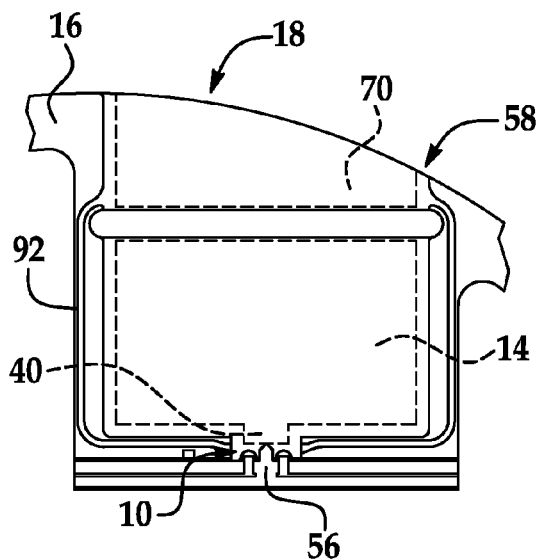
FIG. 1 is a side view of an electrical connection between an electrical device and a receptacle, according to an embodiment of the invention.

FIG. 1 shows an electrical connection 10 between an electrical device 14 and a receptacle 16 into which the device 14 is inserted. The receptacle 16 defines a recess 18 that receives the electrical device 14. The device 14 may be a thruster and the receptacle 16 may be a portion of a projectile that is configured to receive and interface with the thruster, but this is only one possibility among many. Further details regarding the thruster and the projectile are included below, but the structures and steps for making of the electrical connection 10 can be applied to a wide variety of connections involving various kinds of devices, and receptacles or other interfaces to which such devices may be connected. The term "electrical device," as used herein, should be construed widely to involve any of a wide variety of devices which involve electrical connections, from simple components to complicated devices involving a number of components, some of which may not be electrical in their operation.

Figure 2:
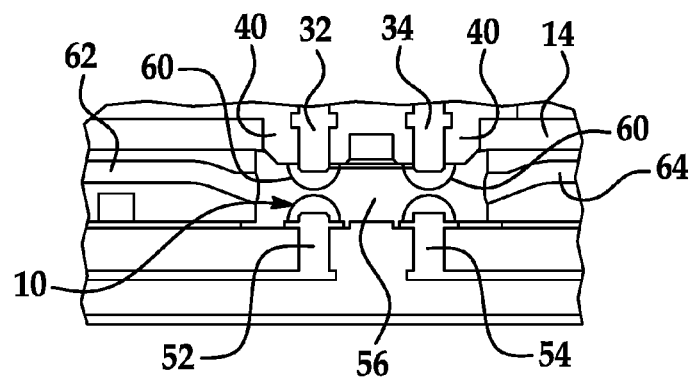
FIG. 2 is a cross-sectional detail view showing details of the electrical connection components of the system of FIG. 1, prior to the soldering process.
Figure 3:
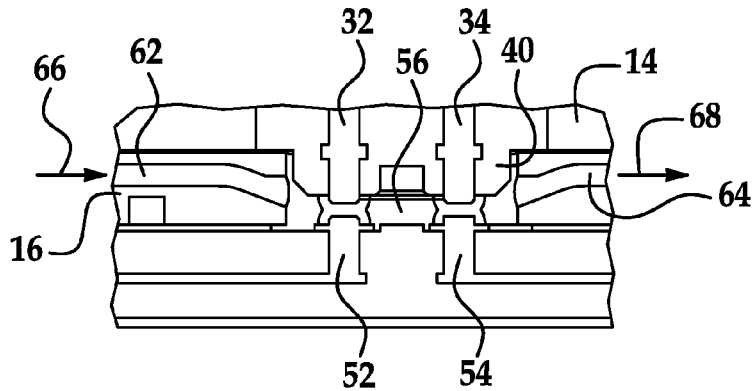
FIG. 3 is a cross-sectional detail view showing details of the electrical connection.

With reference in addition to FIGS. 2 and 3, the device 14 has a pair of device electrical contacts 32 and 34 that are on a protrusion 40 of the device 14. The device electrical contacts 32 and 34 are used for making electrical connection with receptacle electrical contacts 52 and 54 in the receptacle 16. The receptacle electrical contacts 52 and 54 are in a recess 56 of the receptacle 16. The recess 56 is at the bottom of the receptacle 16, opposite an opening 58 where the device 14 is inserted into the receptacle 16. The electrical connection is a blind connection, in that the connection is made in a location within the receptacle 16, externally inaccessible to the installer.

The device electrical contacts 32 and 34 and/or the receptacle electrical contacts 52 and 54 may have solder balls 60 on their ends, to aid in making the electrical connection 10 between the two pairs of electrical contacts. Solder balls are manufactured of traditional tin-based solder alloys. The receptacle 16 has channels 62 and 64 that are used to direct hot air (or other hot gas) the vicinity of the solder balls 60 after insertion of the device 14 into the receptacle 16, in order to melt the solder of the solder balls 60, which then re-solidifies to make solid electrical connections between the contacts 32 and 52, and the contacts 34 and 54.

The channels 62 and 64 may be formed in additive manufacturing process for making the receptacle 16, either separately from or as part of a process for making a larger part, such as a fuselage of a projectile. The diameter of the channel should be sufficiently large to allow for minimum airflow and temperature loss, on the order of 0.762 mm (0.030 inches) diameter. The length of the channel can be as small as 0.635 cm up to 2.54 cm (0.25 inches up to 1.00 inch). The longer is the channel, the hotter the initial injected air temperature should be to account for the heat losses in passage.

Additive manufacturing or three-dimensional printing methods that may be used for producing the receptacle 16 (including the channels 62 and 64 include processes, other layerwise deposition processes, and methods, such as, but not limited to: Selective Laser Sintering (SLS), Stereolithography (SLA), micro-stereolithography, Laminated Object Manufacturing (LOM), Fused Deposition Modeling (FDM), MultiJet Modeling (MJM), aerosol jet, direct-write, inkjet fabrication, and micro-dispense. Areas of overlap can exist between many of these methods, which can be chosen as needed based on the materials, tolerances, size, quantity, accuracy, cost structure, critical dimensions, and other parameters defined by the requirements of the object or objects to be made.

Figure 4:
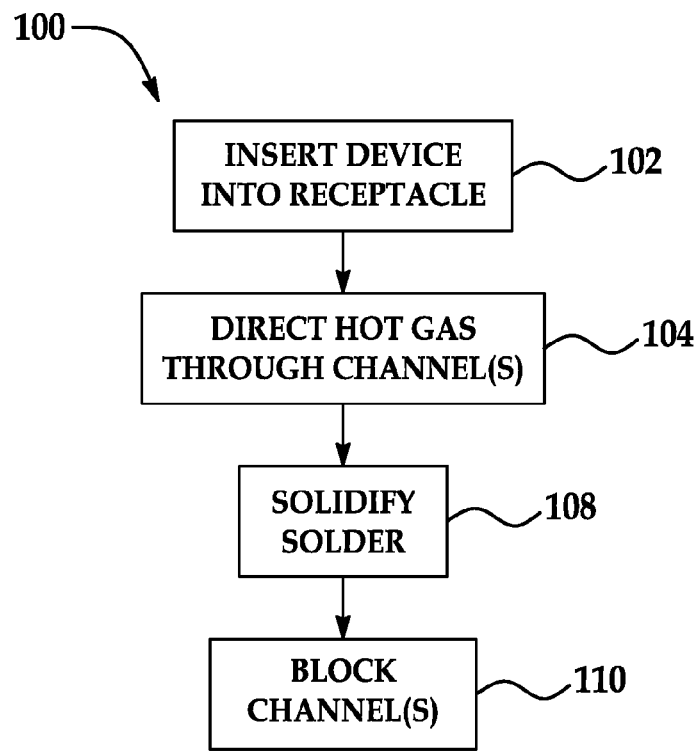
FIG. 4 is a high-level flow chart of the process of making an electrical connection, according to an embodiment of the invention.

The channels or passages 62 and 64 may be used to transport hot gas, such as hot air, in order to heat the solder of the solder balls 60 to make the electrical connection 10. A high-level flow chart of a method 100 for accomplishing the electrical connection 10 is shown in FIG. 4. In step 102 the device 14 is inserted into the receptacle 16 through the opening 18, or is otherwise brought into proximity to the receptacle 16 or other part or device that contains the one or more electrical contacts that are to be electrically connected with the device electrical contacts of the device 14.

In step 104 the hot air (or other hot gas) is directed through at least one of the channels 62 and 64, to heat and melt the solder at the connections between the device contacts 32 and 34, and the receptacle contacts 52 and 54. The hot air may be provided a hot air gun or other suitable hot air source. The hot air may be of suitable temperature and directed through the channels 62 and 64 for a suitable time, in order to melt the solder 60 as necessary in order to make the electrical connection 10. The required temperature, flow velocity and application time varies depending on the size of the solder balls, type of solder alloy and channel dimensions. It will be appreciated that the air (or other gas) temperature, flow rate, and flow timing may be controlled to prevent overheating of the solder and/or other components, for example to prevent flow of the solder away from where the electrical connection 10 is made, and/or to prevent damage to other components, such as parts of the electrical device 14 and/or the receptacle 16.

To determine when the soldering has occurred, it may be possible to load the top of the soldered device with a load cell/displacement measurement device so the user knows when the melting/motion/joining took place. Alternatively the soldering may be detected by other means, or simply assumed to occur in certain conditions.

Many variations are possible, including sending the heated gas through the channels 62 and 64 one at a time. Also, the channels 62 and 64 may be used such that one channel at a time is used for flow of heated air to the soldering location, with the other channel used for the flow of return air. Such a pattern of flow of heated gas is shown by arrows 66 and 68 in FIG. 3.

In step 108 of the method 100 the solder 60 cools and re-solidifies to form the electrical connections between the contacts. The cooling may be simply accomplished by withdrawing the source or hot gas that accomplished the heating. Alternatively active cooling of any of various sorts may be applied.

Step 110, which is optional, involves blocking the channels 62 and 64 after the soldering process has been completed. For example, with reference to FIG. 1, a cap 70 may be placed in the receptacle 16, blocking the openings to the external environment of the channels 62 and 64.

Figure 5:
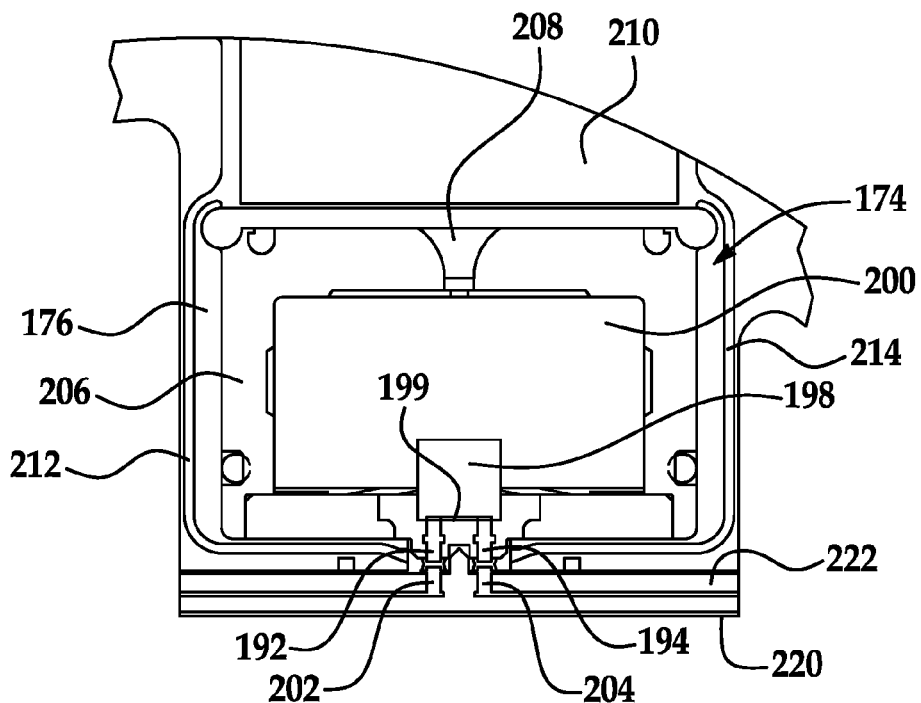
FIG. 5 is a cross-sectional view of an electrical connection involving a specific electrical device, a thruster for a projectile, according to an embodiment of the invention.
Figure 6:
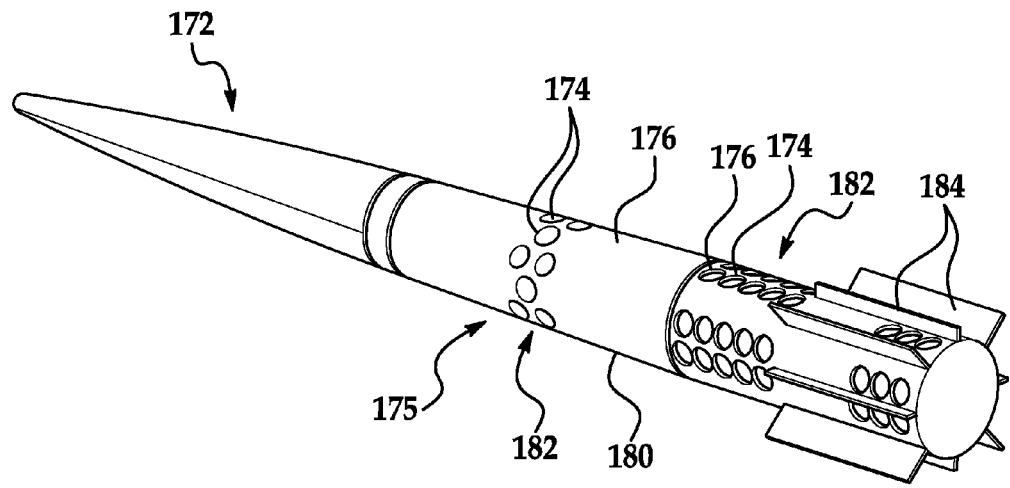
FIG. 6 is an oblique view of a projectile that includes the thruster of FIG. 5.

FIG. 5 shows further details of one example of the electrical device 14, a thruster 174 that is used as part of a projectile 172 shown in FIG. 6. The projectile 172 is an example of a flight vehicle that may include the thruster 174 as part of a series of such thrusters. The projectile 172 may be launched toward a target, such as by being launched from a rail gun. The projectile 172 includes a control system 175 that in turn includes of a series of the thrusters 174 in receptacles 176 that define recesses or spaces 178 at various locations along and around a fuselage 180 of the projectile 172. The combination of the thrusters 174 inserted into the recesses 178 defined by the receptacles 176 produces a series of thruster installations 182 around the fuselage 180. The thrusters 174 are connected to a central controller (not shown), which is used to trigger the firing of the thrusters 174 as desired. The thrusters 174 may be fired individually or in groups, simultaneously or at different times, in order to maneuver the projectile 172 during flight. The maneuvers may involve changes in attitude or translations, or some combination of the two, in order to steer or direct the projectile on an intended course or to an intended destination.

The projectile 172 may have other components, such as fins 184 as well as other components that are not shown (such as a payload, a sensor system, a guidance system, and a communication system), that may be similar to those used in prior projectiles. Details regarding such components are not included herein.

The projectile 172 may be a projectile launched from a railgun launcher. Alternatively the projectile may be other sorts of projectiles. More broadly, such thrusters and systems may be usable in a wide variety of flight vehicles, either powered or unpowered.

The thrusters 174 may have various operating times and/or amounts of thrust. For example, some of the thrusters 174 may have a 1-2 millisecond duration.

Some further details of the thruster 174 will now be discussed. The thruster 174 is produced separately as a self-contained unit, which is to be placed in one of the receptacles 176 (FIG. 6). The thruster 174 has a pair of device electrical contacts 192 and 194 that are used for making electrical connection with receptacle electrical contacts 202 and 204 of the receptacle 176. The electrical connection is a blind connection, in that the connection is made in a location within the receptacle 176, externally inaccessible to the installer. In the illustrated embodiment the connection is made at the bottom end of the thruster 174, where the thruster 174 engages the bottom of the receptacle 176.

The thruster 174 includes a booster 198 that is operatively coupled to a bridge wire 199 that is connected to the device electrical contacts 192 and 194. The booster 198 is also operatively coupled to a propellant 200. Power is applied to the device contacts 192 and 194 to allow the bridge wire 199 to initiate combustion (or detonation) in the booster 198, which in turn initiates combustion in the propellant 200. A casing 206 of the thruster 174 encloses and protects the internal components, the booster 198, the bridge wire 199, and the propellant 200. The casing 206 may have a built-in nozzle 208 through which pass the products from combustion of the propellant 200.

The thruster 174 may be inserted into the receptacle 176, with channels 212 and 214 used in a soldering process to connect the device electrical contacts 192 and 194, and the receptacle electrical contacts 202 and 204 of the receptacle 176. A cap 210 may be used to close off access to the channels 212 and 214 after the soldering process has been completed. The cap 210 may also provide a more aerodynamic surface for the fuselage 180.

In the illustrated embodiment the receptacle electrical contacts 202 and 204 may be parts of a circuit card assembly (CCA) 220. Traces 222 on the CCA 220 may be hooked up to a controller that sends signals controlling the firing of the thruster 174.

Although the invention has been described above mainly in terms of a thruster for a projectile, such a process may be applied to a wide variety of other types of electrical device. For example, lighting devices such as LEDs may be electrically connected using hot gas soldering along the lines described above. A wide variety of other electrical devices with any of various sorts of electrical connection configurations and/or requirements.

Figure 7:
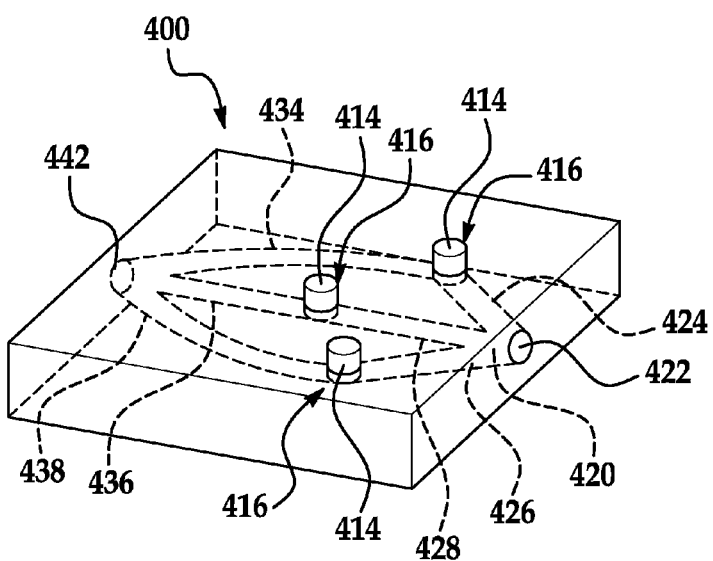
FIG. 7 is an oblique view of a circuit card, according to still another embodiment of the invention.

FIG. 7 shows another embodiment, a printed circuit card 400 that receives a number of electrical devices 414 in a series of receptacles 416 that are connected to circuitry or circuit traces (not shown) of the card. The electrical devices 414 are any of a wide variety of components of an integrated circuit, such as a resistor, capacitor, processor, etc.

The card 400 has a branching internal channel 420 that allows making of soldered electrical connections for all of the devices 414 in a single step. The channel 420 branches out from an entrance port 422 to a series of smaller branch channels 424, 426, and 428, for providing heated gas to all of the receptacles 416 at the same time. There are a corresponding series of branch channels 434, 436, and 438 for directing heated air leaving the receptacles 416 toward an exit port 442.

In the illustrated embodiment the internal channel 420 allows electrical connections to be made for three devices 414 simultaneously. It will be appreciated that a wide variety of numbers of devices may be soldered simultaneously (or substantially simultaneously) using this approach. In addition different channels may be used for different parts of a single device. Further, the use of such channels may be applied to a wide variety of situations beyond the illustrated one of a printed circuit card, where it is desirable to connect multiple electrical devices in an efficient manner. Such an approach may also have the advantage of precisely controlling where heat is applied in a soldering operation, which can help prevent damage to delicate components or devices.

The card 400 (or another such device) may be additively manufactured with the internal channel formed by omitting material where desired. Additive manufacturing processes, and/or dimensions for channels, may be similar to those described above.

The channels for the card 400 may have coatings of low-thermal-conductivity (thermally insulating material) to aid in confining heating to desired local areas. The material may be a thin film applied to the inside of the channels. The thin film may also be an electrochemically deposited spray, aerosol, or powder which also reduces the thermal conductivity of the aforementioned internal channels.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of making an electrical connection, the method comprising:
   inserting an electrical device into a receptacle;
   melting solder where one or more device electrical contacts of the device and one or more receptacle electrical contacts of the receptacle meet, wherein the melting includes directing heated gas through one or more channels in the receptacle to melt the solder; and
   making a solid electrical connection between the one or more device electrical contacts and the one or more receptacle electrical contacts by allowing the solder to cool;
   wherein the making the solid electrical connection includes making a blind electrical connection along a bottom of the receptacle, opposite from an opening where the device is inserted into the receptacle; and
   wherein the one or more channels are along one or more sides of the opening defined by the receptacle.

2. The method of claim 1, wherein the receptacle is additively manufactured, with the one or more channels formed in the receptacle as part of the manufacturing process.

3. The method of claim 1, wherein the directing the heated gas includes directing heated air.

4. The method of claim 3, wherein the directing the heated air includes directing the heated air using a hot air gun.

5. The method of claim 1, wherein the directing includes directing heated gas having a temperature of at least 360° F.

6. The method of claim 1, wherein the directing includes directing the heated gas for a time of at least 1 second.

7. The method of claim 1, wherein the directing includes directing the heated gas through the one or more channels over a length of 0.635 cm to 2.54 cm (0.25 inches to 1.00 inch) for each channel of the one or more channels.

8. The method of claim 1, further comprising blocking the one or more channels after the directing the heated gas through the one or more channels.

9. The method of claim 1, wherein the melting solder includes melting solder balls initially on one or both of the one or more device electrical contacts and/or the one or more receptacle electrical contacts.

10. A method of making an electrical connection, the method comprising:
    inserting an electrical device into a receptacle;
    melting solder where one or more device electrical contacts of the device and one or more receptacle electrical contacts of the receptacle meet, wherein the melting includes directing heated gas through one or more channels in the receptacle to melt the solder; and
    making a solid electrical connection between the one or more device electrical contacts and the one or more receptacle electrical contacts by allowing the solder to cool;
    wherein the one or more device electrical contacts are on a protrusion of the device; and
    wherein the inserting includes inserting the protrusion into a corresponding recess of the receptacle.

11. The method of claim 10, wherein the inserting includes, within the recess, engaging the one or more device electrical contacts with the one or more receptacle contacts, which are parts of a circuit card assembly (CCA).

12. A method of making an electrical connection, the method comprising:
    inserting an electrical device into a receptacle;
    melting solder where one or more device electrical contacts of the device and one or more receptacle electrical contacts of the receptacle meet, wherein the melting includes directing heated gas through one or more channels in the receptacle to melt the solder; and
    making a solid electrical connection between the one or more device electrical contacts and the one or more receptacle electrical contacts by allowing the solder to cool;
    wherein the electrical device is a thruster;
    wherein the receptacle is part of a fuselage of a projectile; and
    wherein the making the connection includes connecting the thruster to a control system of the projectile.

13. The method of claim 10, wherein the making the solid electrical connection includes making a blind electrical connection along a bottom of the receptacle, opposite from an opening where the device is inserted into the receptacle.

14. The method of claim 12, wherein the making the solid electrical connection includes making a blind electrical connection along a bottom of the receptacle, opposite from an opening where the device is inserted into the receptacle.

15. The method of claim 10, wherein the directing includes directing the heated gas through the one or more channels over a length of 0.635 cm to 2.54 cm (0.25 inches to 1.00 inch) for each channel of the one or more channels.

16. The method of claim 12, wherein the directing includes directing the heated gas through the one or more channels over a length of 0.635 cm to 2.54 cm (0.25 inches to 1.00 inch) for each channel of the one or more channels.

17. The method of claim 10, wherein the melting solder includes melting solder balls initially on one or both of the one or more device electrical contacts and/or the one or more receptacle electrical contacts.

18. The method of claim 12, wherein the melting solder includes melting solder balls initially on one or both of the one or more device electrical contacts and/or the one or more receptacle electrical contacts.

19. The method of claim 10,
wherein the electrical device is a thruster;
wherein the receptacle is part of a fuselage of a projectile; and
wherein the making the connection includes connecting the thruster to a control system of the projectile.

20. The method of claim 12, further comprising blocking the one or more channels after the directing the heated gas through the one or more channels.

\* \* \* \* \*